US006229831B1

(12) United States Patent
Nightingale et al.

(10) Patent No.: US 6,229,831 B1
(45) Date of Patent: *May 8, 2001

(54) BRIGHT DIODE-LASER LIGHT-SOURCE

(75) Inventors: John L. Nightingale, Portola Valley; Michael Hmelar, Palo Alto, both of CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/329,846

(22) Filed: Jun. 11, 1999

Related U.S. Application Data

(63) Continuation-in-part of application No. 08/986,540, filed on Dec. 8, 1997, now Pat. No. 6,151,342.

(51) Int. Cl.[7] .................................................... H01S 5/024
(52) U.S. Cl. ............................................ 372/36; 372/109
(58) Field of Search ................................ 372/36, 50, 109

(56) References Cited

U.S. PATENT DOCUMENTS

| | | | |
|---|---|---|---|
| 4,716,568 | 12/1987 | Scifres et al. | 372/36 |
| 4,820,010 | 4/1989 | Scifres et al. | 350/96.15 |
| 4,881,237 | 11/1989 | Donnelly | 372/50 |
| 5,012,477 | 4/1991 | Mesquida et al. | 372/50 |
| 5,268,978 | 12/1993 | Po et al. | 385/33 |
| 5,394,492 | 2/1995 | Hwang | 385/33 |
| 5,629,997 | 5/1997 | Hardy, Jr. | 385/33 |
| 5,828,683 | 10/1998 | Freitas | 372/36 |
| 5,987,043 | 11/1999 | Brown et al. | 372/36 |
| 6,151,342 | * 11/2000 | Nightingale et al. | 372/36 |

FOREIGN PATENT DOCUMENTS

| | | | |
|---|---|---|---|
| 2 153 969 | 5/1973 | (DE) . | |
| 0 717 476 | 6/1996 | (EP) | H01S/3/00 |
| 0 805 527 | 11/1997 | (EP) | H01S/3/025 |
| 4-264789 | 9/1992 | (JP) | H01S/3/18 |
| WO 99/30394 | 6/1999 | (WO) | H01S/3/25 |

OTHER PUBLICATIONS

K.A. McGreer, et al., "Integration of Tunable Segmented Lasers and Electrically Pumped Combiner for WDM," Proceedings of the European Conference on Optical Communication, (EC Montreux, Sep. 12–16, 1993, Regular Papers), vol. 2, No. Conf. 19, Sep. 12, 1993, pp. 265–268.

"Notification of Transmittal of the International Search Report or the Declaration," for PCT Appln. No. PCT/US00/12020 (filed Int'l. May 3, 2000), mailed Aug. 18, 2000, 8 pages in length.

\* cited by examiner

Primary Examiner—James W. Davie
(74) Attorney, Agent, or Firm—Stallman & Pollock LLP

(57) ABSTRACT

A light-source includes a plurality of diode-laser bars. The diode-laser bars are arranged in a parallel array and arranged to emit laser-light in the same direction. The diode-laser bars are mounted on a planar surface of a common heat-sink and are spaced-apart from each other in the emission-direction. Each diode-laser bar has one optical waveguide associated therewith. The optical-waveguides collect laser-light emitted from the diode-laser bars with which they are associated and deliver the collected laser-light to an output-aperture of the light-source. In one arrangement the diode-laser bars are mounted such that the emission-direction is parallel to the planar surface of the heat-sink, and the optical-waveguides are shaped to extend over diode-laser bars adjacent those with which they are associated. In another arrangement the diode-laser bars are mounted on the planar surface via wedge submounts such that the emission-direction is at an acute angle to the planar surface and the spacing of the diode-laser bars is selected such that the optical-waveguides can be straight yet still extend over adjacent diode-laser bars.

34 Claims, 8 Drawing Sheets

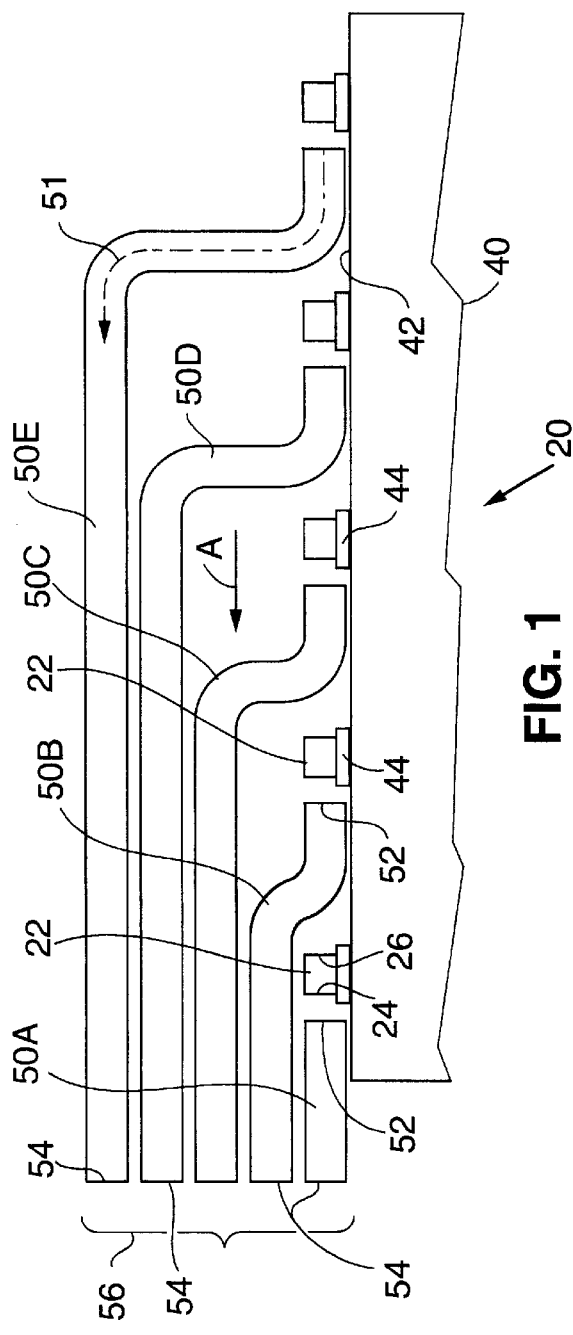
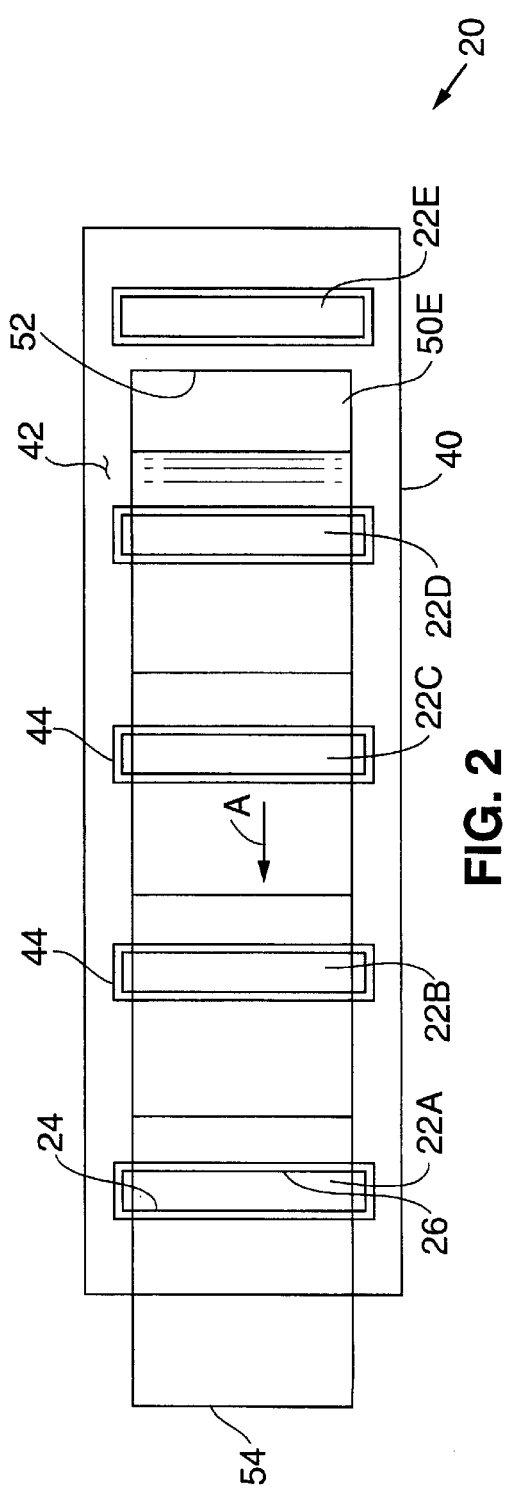

BRIGHT DIODE-LASER LIGHT-SOURCE

REFERENCE TO PRIOR U.S. APPLICATIONS

The present invention is a continuation-in-part of application Ser. No. 08/986,540, filed Dec. 8, 1997, now U.S. Pat. No. 6,151,342.

TECHNICAL FIELD OF THE INVENTION

The present invention relates in general to light-sources including an array of diode-laser bars. The invention relates to a bright, diode-laser-light-source including a plurality of diode-laser bars spaced apart from each other in the laser-light emission-direction thereof, emitted laser-light being coupled into an optical delivery system for delivery to an output-aperture of the light-source.

DISCUSSION OF BACKGROUND ART

Diode-lasers provide a most efficient and compact means of light generation and are attractive as light-sources in many applications, particularly those in which light is required only in a limited range of wavelengths. Such applications include, for example, medical applications such as photodynamic therapy and depilation; machining, welding, and heat treating using light; providing pump-light-sources for solid state lasers; and simply providing illumination.

Diode-laser-light-sources are frequently in the form of a "bar" which includes a plurality of individual lasers on a single semiconductor substrate. The lasers emit from the edge of the bar in a direction perpendicular to the length of the bar. Where one bar is insufficient to provide a desired power or brightness, an array of bars is used, one stacked above the other in a direction perpendicular to the emission-direction. Such an arrangement is usually referred to as a stacked-bar array, or a two dimensional array of emitters.

One relatively simple way of mounting such a stack of diode-laser bars is disclosed in U.S. Pat. No. 5,040,187. Here, in what may be described as a back-plane cooling arrangement, the diode-laser bars are mounted in metalized grooves in a common heat-sink of conductive ceramic material such as beryllia or alumina. In more elaborate arrangements each diode-laser bar is provided with an individual cooler and mechanical arrangements are provided for holding the bars and coolers in a unified array. In all such arrangements, the closer the bars are stacked, i.e., the more compact the output-aperture of the array, the brighter the array will be. Where the closely stacked bars are operated at high power or rapid pulse rates, however, problems are often encountered in removing heat generated during operation of the bars.

One prior-art solution to these problems has been to construct diode-laser bar arrays in which the diode-laser bars are separated horizontally as well as vertically. Such arrays are disclosed, for example, in German patent DE 2,153,969, and in Japanese patent JP 4,426,789. The disclosed arrays include a heat-sink having a stepped mounting surface with a diode-laser bar mounted on each step. Vertical spacing is comparable or even closer than in the case of arrays in which diode-laser bars are only vertically separated, while the horizontal spacing provides greater physical separation which facilitates cooling. The stepped mounting surface of the heat-sink, however, can be expensive to fabricate and also creates difficulty in using fluid-cooling arrangements, in particular microchannel-cooler arrangements, for the surfaces or steps on which the diode-laser bars are mounted.

There is a need for a diode-laser-light-source in which diode-laser bars can be relatively widely spaced while still being effectively cooled and while still delivering light from a compact output-aperture.

SUMMARY OF THE INVENTION

The present invention is directed to providing an array of diode-laser bars, the collective laser-light output of which is used to provide a light-source. The invention is further directed to providing such a light-source wherein the diode-laser bar array is configured to avoid concentration of heat generated by the diode-laser bars.

In one aspect, a light-source in accordance with the present invention comprises a heat-sink having a flat surface and a plurality of diode-laser bars thermally coupled to the flat surface. Each of the diode-laser bars has a front surface. The front surface has a plurality of diode-laser emitting-area-areas therein. Laser-light is emitted from the emitting-areas in an emission-direction generally perpendicular to the front surface of the diode-laser bars. The diode-laser bars are arranged on the flat surface of the heat-sink parallel to each other and spaced apart from each other in the emission-direction.

An optical delivery system is provided for collecting laser-light emitted by the diode-laser bars and delivering the collected laser-light to an output-aperture of the light-source.

In one embodiment of a light-source in accordance with the present invention, the diode-laser bars are mounted on the flat surface such that the emission-direction is at an acute angle to the plane of the flat surface of the heat-sink. The acute angle and the emission-direction-spacing of the diode-laser bars are selected such that laser-light emitted from one of the diode-laser bars is directed over an adjacent one of the diode-laser bars in the emission-direction.

In one example of a light-source in accordance with this embodiment of the present invention, the optical delivery system includes a plurality of rectangular optical-waveguides, one thereof associated with each of the diode-laser bars. The optical-waveguides have an entrance-face and an exit-face. The entrance-face is arranged to collect laser-light from each of the diode-lasers in the bar with which it is associated. The exit-faces of the plurality of optical-waveguides are collectively arranged to provide the output-aperture of the light-source.

In another example of a light-source in accordance with the above-described embodiment of the present invention, the optical delivery system includes a plurality of cylindrical lenses, one thereof associated with each of the diode-laser bars and arranged to collect laser-light only from the diode-laser bar with which it is associated. The lenses may be arranged alternatively to collimate or focus the collected light in the fast axis thereof and direct the collimated or focused light to the output-aperture of the light-source.

In another embodiment of a light-source in accordance with the present invention, the emission-direction is parallel to the plane of the flat surface of the heat-sink. The optical delivery system includes a plurality of rectangular optical-waveguides, one thereof associated with each of the diode-laser bars and arranged such that an entrance-face thereof collects laser-light only from the diode-laser bar with which it is associated. Each of the optical-waveguides located rearward of an adjacent one of the optical waveguides is shaped such that light collected thereby is transported thereby over the adjacent diode-laser bar and any waveguides associated therewith. The optical waveguides are shaped such that exit-faces thereof are collectively arranged to provide the output-aperture of the light-source.

Light-sources in accordance with the present invention may be formed from any above-described diode-laser array and optical delivery system arrangements, stacked, one above the other, or side by side, to increase the number of diode-laser bars in the inventive light-source In one preferred method for forming a light-source in accordance with the present invention a heat-sink having a flat surface is provided. A plurality of diode-laser bars is provided each thereof having a front surface including a plurality of diode-lasers emitting-areas, laser-light being emitted from the emitting-areas in an emission-direction generally perpendicular to the front surface.

A plurality of wedge-shaped submounts is provided, one thereof for each of the plurality of diode-laser bars. Each submount has a thick-end and a thin-end and a wedge-angle, the wedge-angle being an acute angle. Each diode-laser bars is attached to one of the wedge-shaped submounts with the front surface of the diode-laser bar closest the thick-end of the wedge-shaped.

The diode-laser bars and submounts attached thereto are arranged on the flat surface of the heat-sink such that the diode-laser bars are parallel to each other, spaced apart in the emission-direction and thermally-coupled via the submounts to the flat surface of the heat-sink, with the emitting-areas of the diode-laser bars facing the same direction and the emission-direction being at the acute angle to the plane of the flat surface of the heat-sink. The acute wedge-angle of the submounts and the spacing of the diode-laser bars is selected such that laser-light emitted from any one of the diode-laser bars is directed over any adjacent one of the diode-laser bars in the emission direction.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

FIG. 1 is an elevation view schematically illustrating one preferred embodiment of a light-source in accordance with the present invention, including an array of diode-laser bars spaced apart in their emission-direction and mounted on a flat surface of a common heat-sink, with a rectangular optical-waveguide proximate each diode-laser bar for collecting laser-light therefrom, the optical-waveguides being bent to deliver laser-light collected thereby to a common output-plane.

FIG. 2 is a plan view from above, schematically illustrating the light-source of FIG. 1.

DETAILED DESCRIPTION OF THE INVENTION

Figure 3:
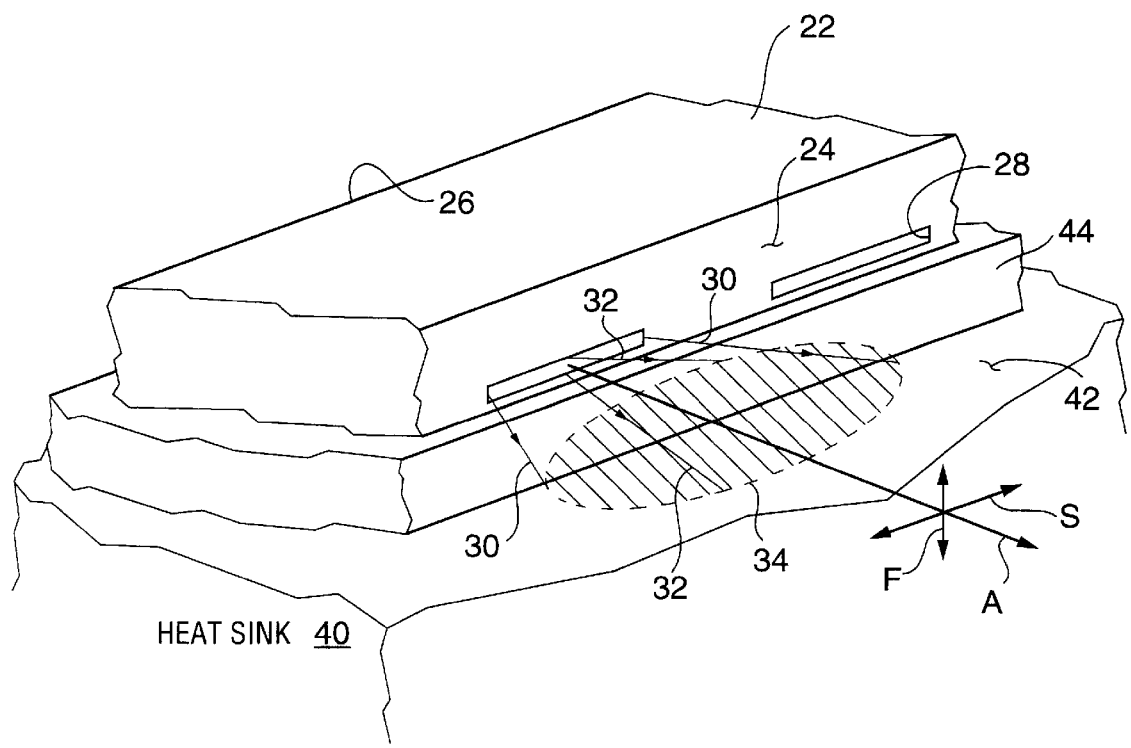
FIG. 3 is a fragmentary perspective view schematically illustrating laser-light emitting facets of a front surface of a diode-laser bar of FIG. 1.

Turning now to the drawings, wherein like components are designated by like reference numerals, FIG. 1, FIG. 2 and FIG. 3 schematically illustrate one preferred embodiment of a light-source 20 in accordance with the present invention. Light-source 20 includes a plurality of one-dimensional diode-laser arrays (diode-laser bars) 22, here, individually referred to as diode-laser bars 22A–E. Each diode-laser bar includes a front surface or front facet 24, and a rear surface or rear facet 26. Each diode-laser bar incorporates a plurality of diode-lasers each of which has an emitting-area 28 (see FIG. 3) in front surface 24 of the diode-laser bar. Other structural details of diode-lasers in a bar are well known to those familiar with the art to which the present invention pertains and, accordingly, are not depicted or discussed herein.

Laser-light is emitted from an emitting-area generally in a direction indicated by arrow A, about perpendicular to the emitting-area, and accordingly, perpendicular to front surface 24. An emitting-area is usually three to one-hundred or more micrometers ($\mu$m) wide by about 1 $\mu$m high. The term laser-light, as used in this description and in the appended claims, is meant to encompass electromagnetic radiation at ultraviolet and infrared wavelengths as well as visible wavelengths. Laser-light from the emitting-area is emitted in the form of a divergent beam, exemplified by rays 30 and 32 (see FIG. 3).

The beam diverges more strongly in the height direction of emitting-area 28 (rays 32) than in the width direction (rays 30). The height and width direction are commonly referred to as respectively the fast and slow axes of the emitted beam (arrows F and S respectively in FIG. 3). The fast and slow axes are orthogonal to each other and perpendicular to emission-direction A, i.e., are respectively perpendicular to and parallel to the length of the diode-laser bar. The beam has an elongated, somewhat-elliptical cross-section 34 in the vicinity of the emitting-area. Diode-laser bars 22 are arranged substantially parallel to each other with front surfaces 24 thereof facing in emission-direction A.

Diode-laser bars 22 are preferably mounted on, i.e., thermally coupled to, a common heat-sink 40 on a flat (planar) surface 42 thereof. Heat-sink 40 may be formed from a heat conductive ceramic material such as beryllia or alumina, or from a metal such as copper provided with, optionally, electrically-insulating pads or an electrically-insulating coating on which diode bars can be mounted. A (synthetic) diamond layer is particularly preferred as an insulating coating as it is effective as a heat "spreader" between the diode-laser bars and the heat-sink to improve thermal coupling of the diode laser bars to the heat-sink. Heat-sink 40 may be passive in operation, or may be actively cooled, for example, by a circulating fluid, or by thermo-electric cooling means in contact with a surface (not shown) opposite to surface 42. As design of such heat-sinks is well known in the art, a detailed description is not presented herein.

The diode-laser bars may be mounted for either series or parallel connection. The present invention is not limited by the manner in which the diode-laser bars are electrically interconnected. For series connection, in the case where surface 22 is an electrically-insulating surface, each diode-laser bar 22 is mounted on an electrically-conductive pad or "island" 44 having about the same dimensions as a diode-laser bar. Adjacent islands 44 are electrically-isolated from each other. An island 44 is preferably between about 10.0 and 500.0 μm thick and serves as a pedestal or spacer for raising a diode-laser bar 22 above surface 42. The (length) dimension of an island may be extended in a direction perpendicular to the emission-direction A to facilitate electrical connection to a diode-laser bar mounted thereon.

Only five diode-laser bars 22 are illustrated in the embodiment of FIG. 1, and in other embodiments of the present invention described hereinbelow, for simplicity of illustration. In the embodiment of FIG. 1, and in these other embodiments, more or less diode-laser bars 22, may be included without departing from the spirit and scope of then present invention.

Islands 44 may be conveniently formed by lithographically patterning and plating. Islands may also be formed by laser machining. An island 44 may be a simple conductor or composite structure formed from a conductor and an insulator. Whatever means are employed for mounting diode-laser bars 22, it is important that they are mounted in a way which ensures good thermal-coupling between the diode laser bars and the heat-sink.

Preferably a diode-laser bar 22 is attached to an island 44 by a reflow soldering method. In a preferred reflow soldering method, a plurality of island areas 44 are produced on heat-sink 44. The number of islands corresponds to the number of diode-laser bars to be mounted. Each of these islands has about the same dimensions as a diode-laser bar to be mounted thereon. The islands are spaced apart from each other and aligned with respect to each other corresponding to the desired spacing and alignment of diode-laser bars.

A layer of solder, preferably a low melting-point soft solder such as an indium solder, is deposited on each of the islands. The layer should be sufficiently thick that, when melted, it can wet the surface of the island and a diode-laser bar placed thereon, but preferably not so thick that a significant quantity of solder can escape from the junction between the diode-laser bar and the island. Even a relatively small amount of escaped excess solder may wet front surface 24 of a diode-laser bar to an extent where emitting-areas 28 thereof, which are located very close to the diode-laser bar/island junction, are contaminated. For indium solder, a preferable thickness is about 7 μm, this thickness should not, however, be considered limiting. According to the above-discussed criteria, a suitable thickness for a particular solder can be readily determined by simple experiment.

Once the solder layer has been deposited, diodes to be mounted are placed on corresponding islands in approximate alignment therewith. The heat-sink and diode-laser bars are then placed in an oven wherein the temperature is raised to a point sufficient to melt the solder layer on the islands. This melting preferably takes place in a reducing atmosphere, such as hydrogen or forming gas, to remove any oxide skin on the molten solder. Preferably a vacuum is also created in the oven which serves to eliminate any trapped gas from the solder-filled junctions between diode-laser bars and islands. Equilibration of surface tension forces in the molten solder layer at the periphery of the diode-laser bar/island junction, automatically and precisely aligns the diode-laser bars with the islands on which they are mounted. The solder is then allowed to cool and solidify, thereby bonding the diode-laser bars to the islands.

Continuing now with reference to FIGS. 1 and 2, light emitted from emitting-areas 28 of all diode-lasers in a diode-laser bar 22 are collected by an approximately rectangular optical-waveguide 50, here, individually designated as waveguides 50A–E associated with diode-laser bars 22A–E respectively. The terminology "rectangular optical-waveguide", in this description and the appended claims, refers to an optical-waveguide having a generally rectangular cross-section. Each optical-waveguide 50 has an entrance-face 52 thereof located proximate front-surface 24 of a diode-laser bar 22 with which it is associated for receiving or collecting light emitted from emitting-areas 28. The collected light is transported by the optical-waveguide to an exit-face 54 thereof. Entrance-face 52 is preferably arranged perpendicular to emission-direction A of the diode-laser bar. Optical-waveguide 50A, which may be referred to as the first optical-waveguide, associated with the first diode-laser bar 22A, is straight. The second optical-waveguide 50B is bent or shaped (in the length direction) in a manner which allows entrance-face 52 thereof to be perpendicular to emission-direction A and to the propagation axis 51 (the length direction) of the optical-waveguide, while allowing the optical-waveguide to extend over the adjacent diode-laser bar 22A and its associated optical-waveguide 50A. Third, fourth and fifth optical-waveguides 50C–E are bent or shaped in a like manner allowing them to extend over respectively waveguides 50B–D and the diode-laser bars with which they are associated.

Optical-waveguides 50 preferably have a width sufficient to extend over all emitting-areas 28 in a diode-laser bar 22, and preferably has a height (thickness) at least about equal, and preferably greater than, an emitting-area 28. Optical-waveguides 50B–E are bent or shaped in a manner which provides that exit-faces 54 thereof are collected together as illustrated in FIG. 1 to form an output-aperture 56 for light-source 20. Output aperture 56 is planar and forward of all diode-laser bars in emission-direction A. Output-aperture 56 can provide the same light-emission density as a prior-art vertically-stacked array of diode-laser bars, while permitting horizontal spacing of diode-laser bars 22A–E for optimum cooling.

A rectangular optical-waveguide can be a simple, glass plate polished on all sides, or may be fabricated using a pre-form having a rectangular cross-section and drawing the pre-form into an optical waveguide of desired thickness. An unclad glass-plate optical-waveguide may have dimensions about n×10 mm×p, where n is between about 3 and 100 mm, and p is between about 0.1 mm and 2 mm. A glass plate clad with an optical epoxy would have about the same core dimensions. A drawn "ribbon" optical-waveguide may have a thickness between about 50 $\mu$m and 750 $\mu$m, and preferably has a thickness of 500 $\mu$m. A ribbon fiber may be clad, with the cladding thickness being between about 2 $\mu$m and 500 $\mu$m. Optical-waveguide losses can be minimized by providing an antireflection coating on one or both of entrance and exit-faces 52 and 54. An optical-waveguide may also be formed from a plastic material, or may be in the form of a hollow metal conduit. An optical-waveguide may be converging (tapered) or diverging with straight or curved sidewalls. A rectangular optical-waveguide may also have smoothed or rounded, i.e., have a generally rectangular or "rounded-corner rectangular" cross-section. This can be advantageous in reducing optical-waveguide losses due to diffraction or scattering at defects or chips at otherwise-sharp edges of optical-waveguides.

The arrangement of light-source 20 has certain advantages in the area of manufacturing costs. For example, islands 44 for mounting diode-laser bars 22 on heat-sink 40 may be inexpensively applied by conventional substrate patterning techniques well-known in the electronic industry. Further, the above-discussed reflow-soldering process allows bonding an accurately aligning the plurality of diode-laser bars 50 on corresponding islands 44 in a single operation.

Typical dimensions of a diode-laser bar 22 are about 10.0 (millimeters) mm long×1.0 mm wide×130.0 $\mu$m high. Preferably, diode-laser bar 22 is mounted on island 44 at a height of about 50.0 $\mu$m above surface 42 of heat-sink 40. An electrical connection (not shown) on top of diode-laser bar 22 is about 50.0 $\mu$m thick. The top of the electrical connection would thus be about 230.0 $\mu$m above surface 42.

Spacing of diode-laser bars 22 is preferably sufficient that the heat-sink area available, per bar, is greater than about twice the area of a bar. A preferred spacing is about 3.0 mm (front-surface to front-surface). At this spacing, ten diode-laser bars could be accommodated on a heat-sink 40 of length about 30.0 mm with adequate space for electrical connections and the like. For optimizing collection of light in the slow-axis, optical waveguides 50 (accordingly entrance-faces 52 thereof) preferably have a width which extends beyond the outermost emitting-areas 28 of a diode-laser bar 22. Optical-waveguides 50 (accordingly entrance-faces 52 thereof) preferably have a height of 50 $\mu$m and preferably a height which maximizes collection of light in the fast-axis. In this regard, a height of about 500.0 $\mu$m has been found to be effective. A waveguide spacing (pitch) of 500.0 $\mu$m would provide, for diode-laser bars 22 having about 50.0 Watts (W) output power, that source 20 would deliver about 200.0 W output from a rectangular aperture about 10.0 mm long and 5.0 mm high.

An optical-waveguide 50 having a width of about 10.0 mm and a height of about 500.0 $\mu$m is essentially rigid. Accordingly it can not be reliably "flexed" to provide the curved transport-path for laser light required of optical-waveguides 50B–E in FIG. 1. Optical-waveguides 50 are preferably permanently formed into the required curvature by heating a straight optical-waveguide to its softening point and allowing it to "slump" or "sag" onto a rigid form having the shape or curvature required of the optical-waveguide. The slumped optical-waveguide is then cooled and becomes rigid in the required curvature. This procedure may be applied to either clad or unclad optical-waveguides.

Figure 4:
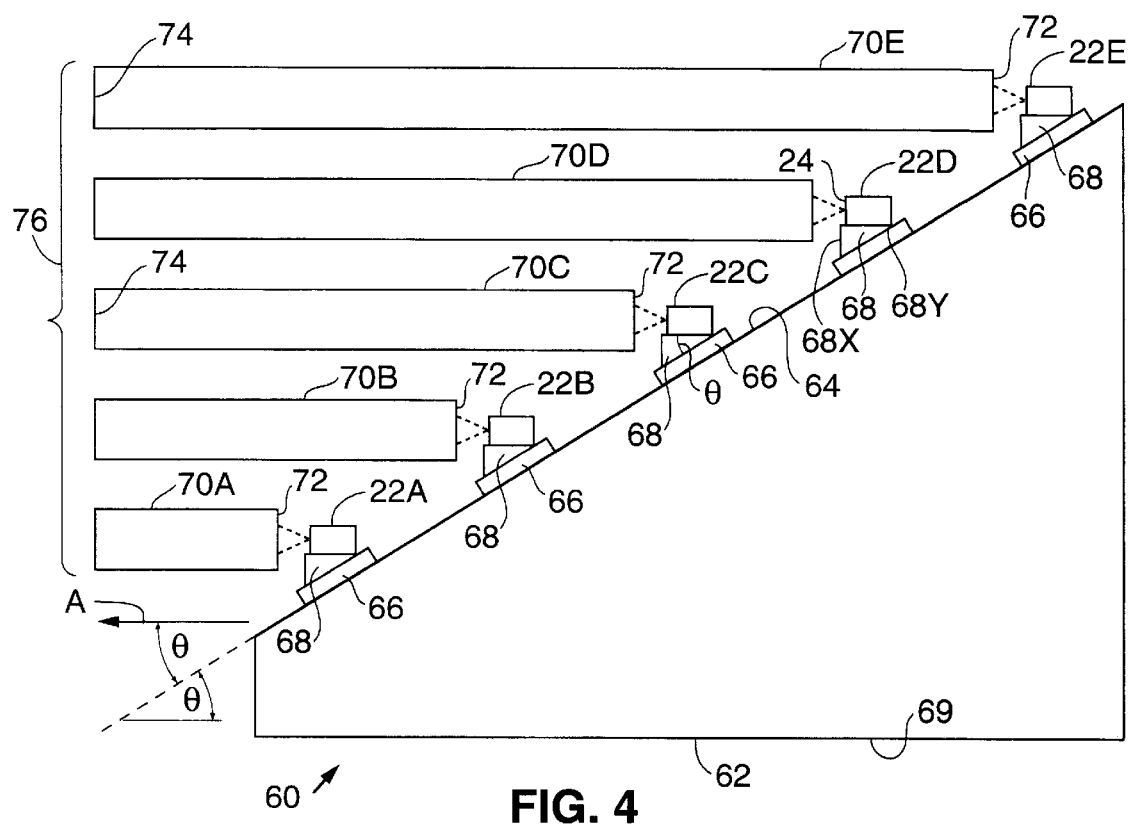
FIG. 4 is an elevation view schematically illustrating another embodiment of a light-source in accordance with the present invention, including an array of diode-laser bars spaced apart in that direction and mounted on an inclined flat surface of a wedge-shaped common heat-sink with the emission-direction of the waveguides at an acute angle to the flat surface, a rectangular optical-waveguide being proximate each diode-laser bar for collecting laser-light therefrom and delivering the collected laser-light to a common output-plane.
Figure 5:
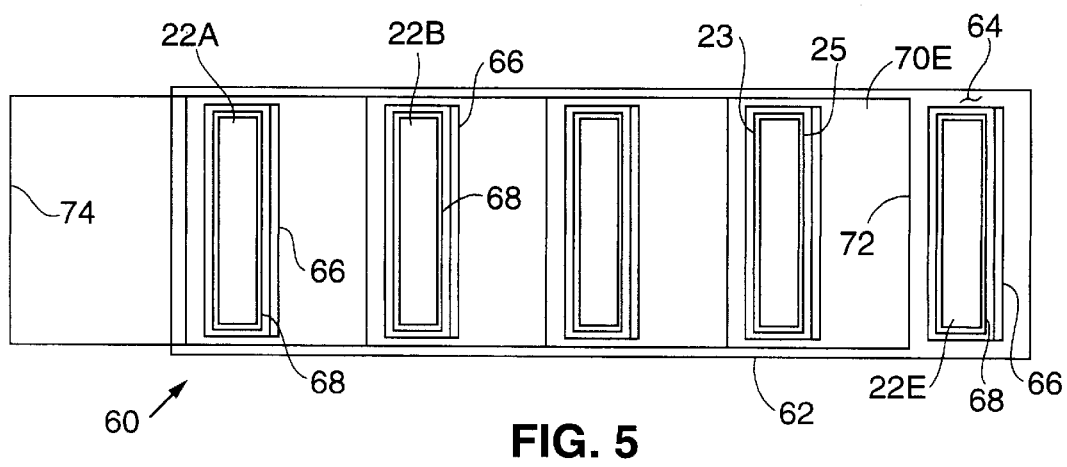
FIG. 5 is a plan view from above, schematically illustrating the light-source of FIG. 4.

Referring now to FIGS. 4 and 5, another embodiment 60 of a light-source in accordance with the present invention is illustrated. Light-source 60 is similar to light-source 20 of FIG. 1 with the exception that diode-laser bars 22 (again, individually designated 22A–E) are mounted on a wedge-shaped heat-sink 62. Heat-sink 62 is preferably a water-cooled heat-sink made from highly heat-conductive metal such as copper or molybdenum. Diode-laser bars 22 are mounted on a flat upper-surface 64 of heat-sink 62 via insulating pads 66 and wedge-shaped submounts 68. submounts 68 each have a "thick-end" 68X and a thin-end 68Y. Diode-laser bars 22 are attached to submounts 68 with front surfaces 24 thereof closest thick-end 68X of the submounts. Submounts 68 are also preferably made from copper. This facilitates electrical connection to the diode-laser bars and also spreads thermal load from the diode-laser bars on insulating pads 66, thereby optimizing thermal-coupling to heat-sink 62.

Figure 4A:
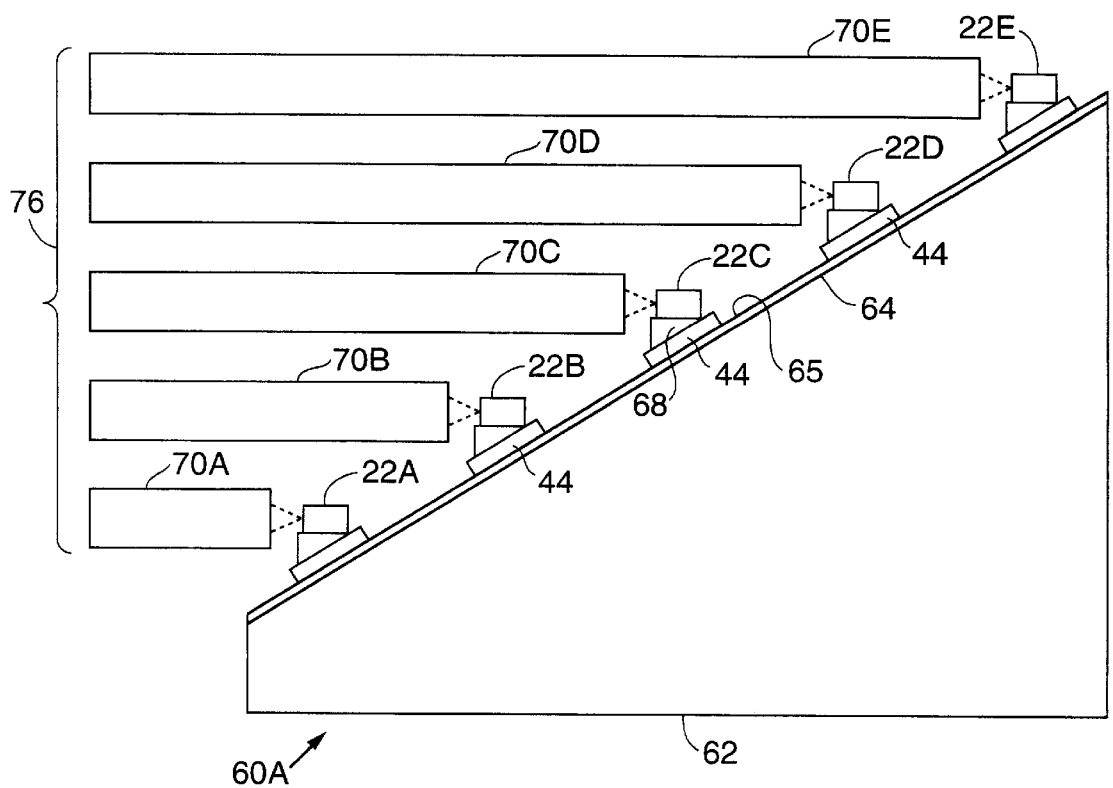
FIG. 4A is an elevation view schematically illustrating the light-source of FIG. 4, having an alternative heat-sink arrangement including a layer of synthetic diamond on the inclined flat surface of the heat-sink.

Additional heat-spreading may be provided by a layer of synthetic diamond on surface 64 of heat-sink 42. By way of example, FIG. 4A schematically illustrates a light-source 60A which is the same in most respects to light-source 60 of FIG. 4, with the exception that a layer 65, of synthetic diamond, covers mounting surface 64 of heat-sink 62. As diamond layer 65 is an insulating layer, insulating pads 66 of light-source 60 are replaced by metallic (electrically-conductive) mounting pads 44 as described above for light-source 20 of FIG. 1 or eliminated entirely. Electrically-conductive mounting pads (attachment areas) are preferably provided on a diamond layer by metalizing (metal plating or metal coating) the diamond layer and patterning the plating to provide the attachment areas. Clearly, a light-source such as light-source 60, and any other hereinafter-described light-source in accordance with the present invention may also be assembled on a ceramic heat-sink in a manner similar to that described above with reference to light-source 20.

Preferably, heat-sink 62 and submounts 68 each have the same wedge-angle, and submounts 68 are mounted on pads 66 with wedge-angles thereof opposed to the wedge-angle of heat-sink 141 such that emission-direction A of diode-laser bars 22 is at an acute angle $\theta$ to surface 64, here determined by a corresponding wedge-angle $\theta$ of submounts 68. Angle $\theta$ is selected, cooperative with spacing of diode-laser bars 22, such that laser-light emitted from any one diode-laser bar 22 is directed over an adjacent diode-laser bar 22, forward thereof, in emission-direction A. As illustrated in FIG. 4, heat-sink 62 also has a wedge-angle $\theta$, whereby emission-direction A is generally parallel to base 69 of heat-sink 62. While this is convenient for enclosing light-source 60 in a rectangular package, it should not be construed as limiting the present invention. Heat-sink 62 may have a wedge-angle different from the angle between emission-direction A and surface 64, and may even be a simple rectangular shape.

In one preferred example of light-source 60, diode-laser bars 22 have a length and width of 9.5 mm and 1.0 mm respectively. Sub-mounts 68 have a length and width of 10.0 mm and 3.0 mm respectively, and wedge-angle of the sub-mounts is 22°. Preferably, diode-laser bars 22 are attached to their sub-mounts 68 before being mounted on heat-sink 62. This provides that the diode-laser bars can tested at or near full power before finally being assembled into light-source 60. Without the submounts this would not be practical if at all possible.

Continuing now with reference to FIGS. 4 and 5, each diode-laser bar 22 is provided with an optical-waveguide 70. Optical-waveguides 70 are individually designated 70A–E, to correspond with diode-laser bars 22A–E. Entrance-faces 72 of the optical-waveguides are perpendicular to emission-direction A of the diode-laser bars. Optical-waveguides 70 transport light from diode-laser bars to exit-faces 74 thereof arranged in a common output-aperture or output-plane 76 forward of diode-laser bars 22 in emission-direction A. Preferred dimensions of height and width of optical-waveguides 70 are as discussed above for optical-waveguides 50 of light-source 20.

Light-source 60 has an advantage that diode-laser bars 22 may be mounted on a common flat surface while still permitting the use of straight-waveguides 70 with entrance-faces 72 thereof arranged perpendicular to the emission-direction of light from the diode-laser bars. This avoids a need to shape the waveguides as in above-discussed light-source 20. A further advantage is that, even in massive form, heat-sink 141 is easier to fabricate than prior-art stepped heat-sinks. Still a further advantage of heat-sink 62 is that flat surface 64 thereof permits more uniform fluid-cooling than the stepped surface of prior-art heat-sinks.

Figure 6:
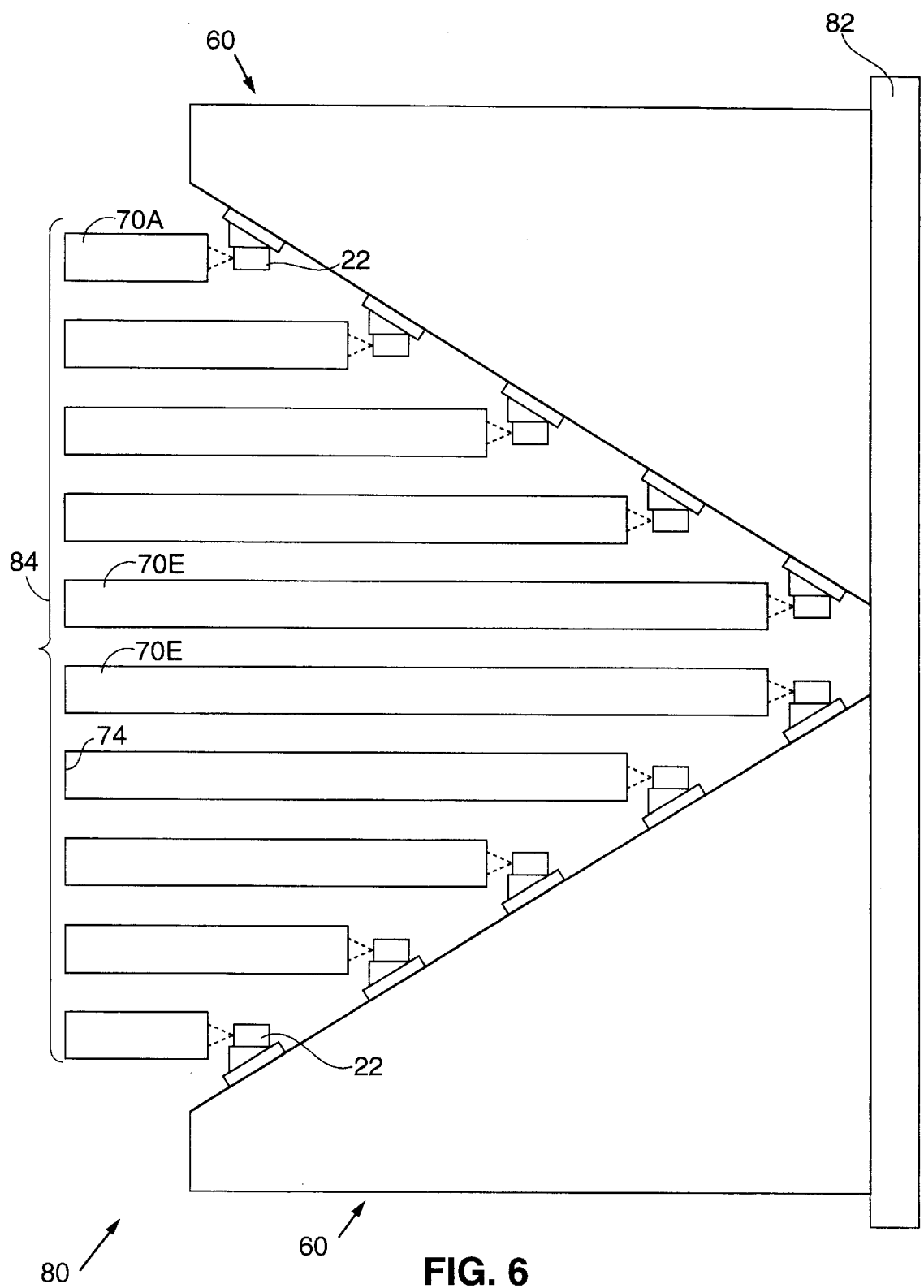
FIG. 6 is an elevation view schematically illustrating still yet another embodiment of a light-source in accordance with the present invention, including two light-sources as depicted in FIG. 4, stacked together, with one thereof inverted over the other.

Referring now to FIG. 6, yet another embodiment 80 of a light-source in accordance with the present invention is depicted. Light-source 80 includes two light-sources 60 mounted on a mounting-plate 82. Light-sources 60 are arranged such that exit-faces 74 of optical-waveguides 70 are equally spaced in a common aperture or common plane 84. Equal spacing of optical-waveguide exit-faces, in this and other embodiments of the present invention described herein, is preferable for achieving uniformity of illumination of the common output-aperture provided by the optical-waveguides. Using light-sources 60, having straight optical-waveguides, only two sources may be stacked while still preserving equal spacing of optical-waveguide exit-faces.

It should be noted here that in the embodiment of FIG. 6, and other embodiments of the present invention depicted herein, details of water-cooling connections to heat-sinks and electrical connections to diode-laser bars is omitted for clarity. As such details, and other details of laser-diode array packaging, are well known to those skilled in the art to which the present invention pertains, no description of such details is presented herein.

Figure 7:
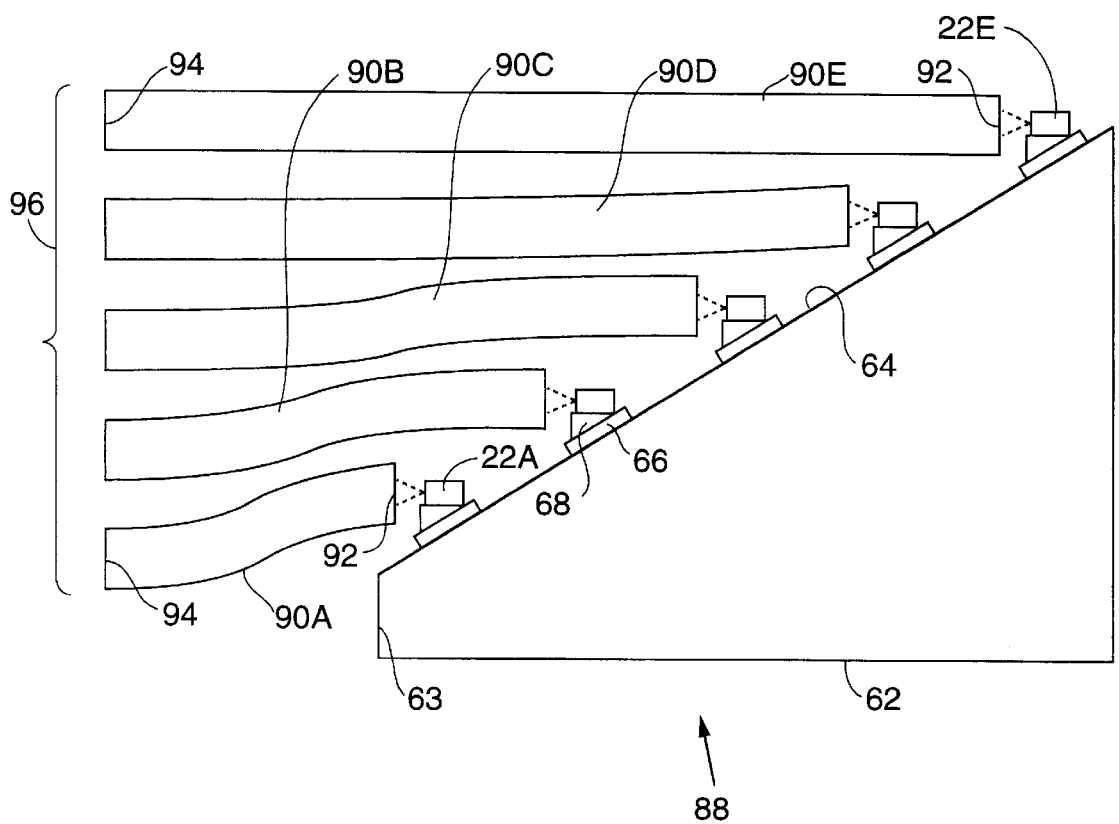
FIG. 7 is an elevation view schematically illustrating still another embodiment of a light-source in accordance with the present invention, similar to the light-source of FIG. 4, but with optical-waveguides shaped such that exit-faces thereof have a predetermined spacing in the common output-plane.

Referring to FIG. 7 still another embodiment 88 of a light-source in accordance with the present invention is illustrated. Light-source 88 provides more flexibility for stacking than light-source 60. Light-source 88 is similar to light-source 60 with regard to the heat-sink arrangement (heat-sink 62) and the mounting and arrangement of diode-laser bars 22 on the heat-sink, but differs in regard to the arrangement of optical-waveguides. In light-source 88, optical-waveguides 90 (90A–E) are bent or shaped such that exit-faces 94 thereof are equally spaced in a common aperture 96 which extends below mounting-surface 64 of heat-sink 62. This provides that two or more light-sources 88 may be stacked with exit-faces of optical waveguides 90 equally spaced in a common output-aperture.

Figure 8:
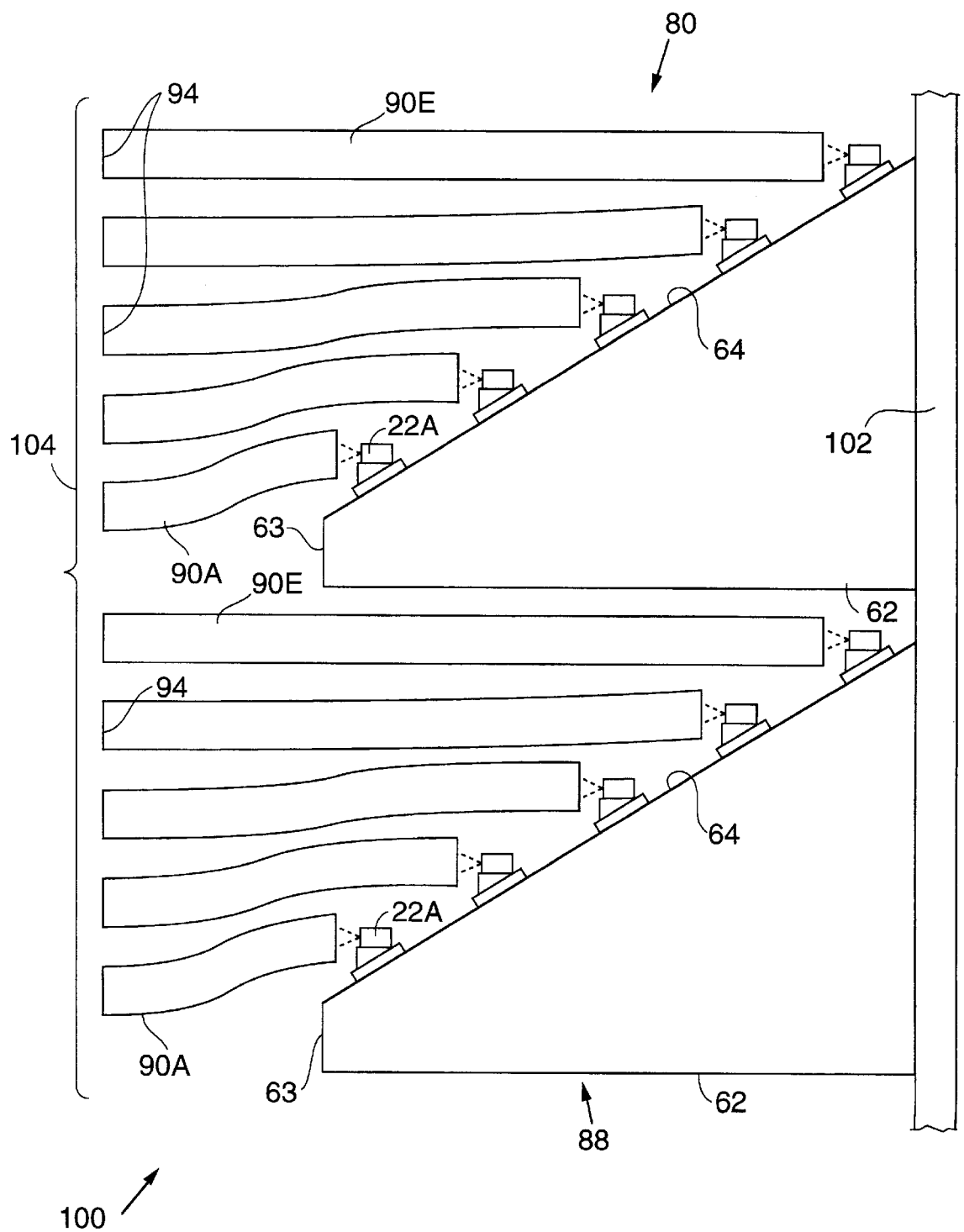
FIG. 8 is an elevation view schematically illustrating a further embodiment of a light-source in accordance with the present invention, including two light-sources as depicted in FIG. 7 stacked top-to-bottom.

One such stack of light-sources 88 is depicted in FIG. 8 as light-source 100. It should be noted here that the curvature of waveguides 90 is occasioned because of practical consideration of placing diode-laser bar 22A at some finite distance from the end of heat-sink 62 and because it is preferable, that the wedged-shaped heat-sink have a finite thickness at its "thin-end" 63. The finite thickness allows for sufficient thermal-capacity (in the case of a solid heat-sink) or space for coolant flow (in the case of a fluid-cooled heat-sink to provide for proper cooling of diode-laser bar 22A.

In light-source 100, two light-sources 88 are mounted, one above the other, on a mounting-plate 102. Light-sources 88 are arranged such that exit-faces 94 of optical-waveguides 90 are equally spaced in an exit-aperture or exit plane 104. Because of the arrangement of bent, rigid optical-waveguides used with light-sources 88, there is, in theory at least, no limit to the amount of these light-sources that can be stacked while still maintaining equal spacing between optical-waveguide exit-faces. Those skilled in the art to which the present invention pertains will also recognize, without further illustration, that a plurality of light-sources 88 may be arranged one above the other and side by side in order to achieve a larger emitting aperture (area).

It should be noted here that while output-apertures of the above-described inventive light sources are described and depicted as planar, with exit-face of the rectangular optical-waveguides being co-planar, this should not be considered limiting. Those skilled in the art will recognize that exit-faces of the waveguides may be arranged to form an aperture of some application-specific, arbitrary shape without departing from the spirit and scope of the present invention.

Light-sources in accordance with the present invention have been described in terms of laser-light from diode-laser bars being delivered to an aperture by optical-waveguides. The inventive mounting arrangement of diode-laser bars characteristic of light-sources 60 and 88, however, is equally adaptable to collection and delivery of laser-light from the diode-laser bars by lenses. A description of examples of the use of cylindrical lenses in light-sources in accordance with the present invention is set forth below. A purely cylindrical lens, such as might be formed from a glass rod or an optical fiber, is but one form of anamorphic lens, i.e., a lens having different power in two orthogonally arranged axes, for example, the above described fast and slow axes. A true cylindrical lens, of course, has power in only one axis. The lenses may be refractive elements with either spherical or a spherical surfaces or diffractive elements.

Figure 9:
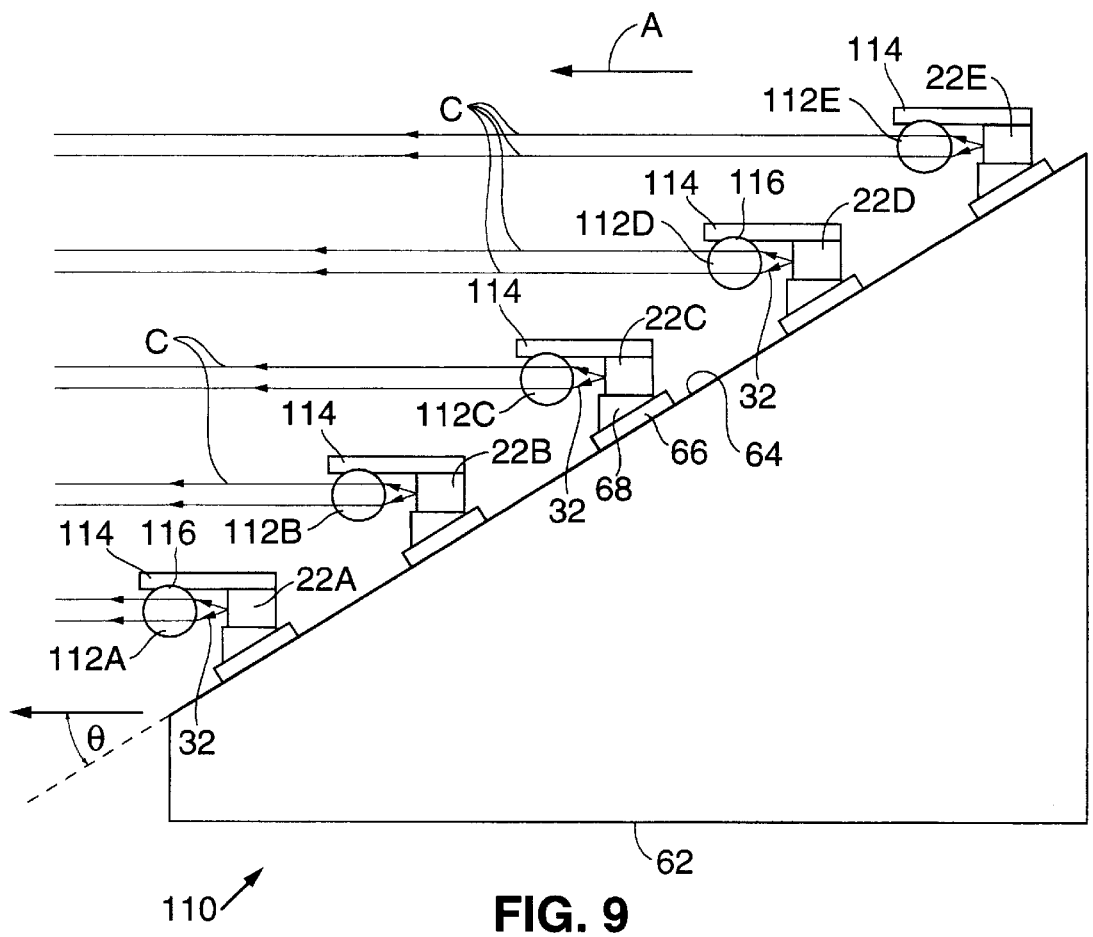
FIG. 9 is an elevation view schematically illustrating yet a further embodiment of a light-source in accordance with the present invention, including an array of diode-laser bars spaced apart in that direction and mounted on an inclined flat surface of a wedge-shaped common heat-sink with the emission-direction of the waveguides at an acute angle to the flat surface, a cylindrical lens being proximate each diode-laser bar for collecting and collimating laser-light therefrom and delivering the collected laser-light to a common output-plane.
Figure 10:
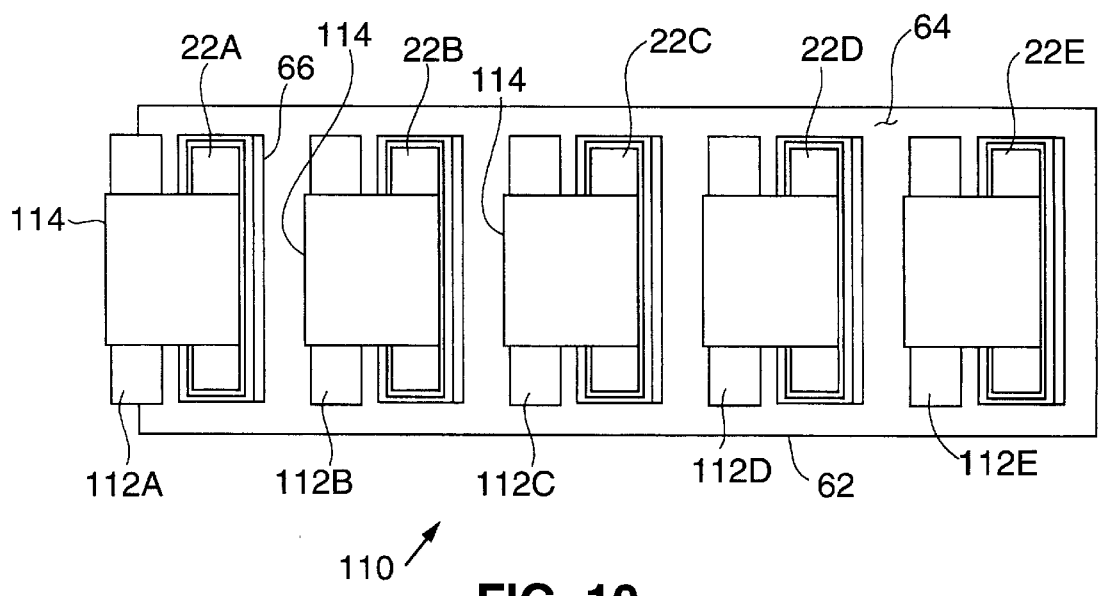
FIG. 10 is plan view from above schematically illustrating the light-source of FIG. 9.

Referring now to FIGS. 9 and 10, a light-source 110 is illustrated. Light-source 110 is similar in most respects to above-described light-source 60 with the exception optical-waveguides 70 are omitted and, instead, cylindrical lenses 112 (individually designated 112A–E) are provided for collimating light from diode-laser bars 22. Lenses 162 are arranged such that laser-light from diode-laser bars 22 is collimated in the fast-axis of the diode-laser bars. Divergent rays 32 (see FIG. 3) emitted by diode-laser bars 22 are formed into collimated beams indicated by arrows C. The collimated beams are parallel to emission-direction A of the diode-laser bars. It should be noted, however, that as the beams are collimated in the fast-axis only, the beams will still be divergent in the slow-axis. Accordingly, in any given plane perpendicular to emission-direction A, the beams will have different widths in the slow axis because of the different path-lengths of laser-light from diode-laser bars 22A–E.

Those skilled in the optical art will recognize that focusing elements, such as lenses, may also be configured and arranged to focus laser-light collected thereby into a common focal-plane or output-plane. This may be accomplished, for example, with appropriate selection of the distance of the common output-plane from heat-sink 62, by providing lenses with progressively longer focal lengths associated with diode-laser bars 22A–E. Alternatively, the lenses may have the same focal length, and an optical arrangement such as a cascaded prism array or the like provided between the lenses and the focal plane for equalizing the optical-path length from each lens to the common focal plane. It is further possible to select a different wedge-angle for each of sub-mounts 68, such that collected laser-light is focussed at a common-level or point in the common focal-plane. These and other optical-delivery arrangements for light from diode-laser bars 22 may be deployed without departing from the spirit and scope of the present-invention.

The present invention has been described in terms of a preferred and other embodiments. The present invention is not limited, however, to those embodiments described and depicted. Rather, the invention is defined by the claims appended hereto.

What is claimed is:

1. A light-source comprising:
   a heat-sink having a flat surface;
   a plurality of diode-laser bars each thereof having a front surface, said front surface having a plurality of diode-lasers emitting-areas therein, laser-light being emitted from said emitting-areas in an emission-direction generally perpendicular to said front surface;
   said diode-laser bars being arranged parallel to each other and spaced apart in said emission-direction, said bars being thermally-coupled to said flat surface of said heat-sink; and
   an optical delivery system for collecting laser-light emitted by said diode-laser bars and delivering said collected laser-light to an output-aperture of the light-source.

2. The light-source of claim 1, wherein said emission-direction is at an acute angle to the plane of said flat surface of said heat-sink, and said acute angle and said emission-direction-spacing of said diode-laser bars are selected such that laser-light emitted from any one of said diode-laser bars is directed over any adjacent one of said diode-laser bars in said emission-direction.

3. The light-source of claim 2, wherein said optical delivery system includes a plurality of rectangular optical-waveguides, one thereof associated with each of said diode-laser bars.

4. The light-source of claim 3 wherein each of said optical-waveguides has an entrance-face and an exit-face said entrance-face arranged to collect laser-light only from the said diode-laser bar with which it is associated, and said exit-faces of said plurality of optical-waveguides being collectively arranged to provide said output-aperture of the light-source.

5. The light source of claim 2, wherein said entrance-face of each of said laser diodes is arranged to collect laser-light emitted from all of said emitting-areas of the said laser-diode bar with which it is associated.

6. The light-source of claim 2, wherein said optical delivery system includes a plurality of anamorphic lenses, one thereof associated with each of said diode-laser bars and arranged to collect laser-light only from the diode-laser bar with which it is associated.

7. The light-source of claim 6, wherein said laser-light emitted by each of said emitting-areas of said diode-laser bars has a fast-axis and a slow-axis, said fast-axis and said slow-axis being orthogonal to each other and perpendicular to said emission-direction with, said fast-axis being perpendicular to the length of said of a said diode-laser bar, and wherein each of said anamorphic lenses is a cylindrical lens arranged such that said laser-light collected thereby is collimated thereby in said fast axis, said collimated laser-light being delivered to said output-aperture of the light-source.

8. The light-source of claim 6, wherein said laser-light emitted by each of said emitting areas of said diode-laser bars has a fast-axis and a slow-axis, said fast-axis and said slow-axis being orthogonal to each other and perpendicular to said emission-direction with said fast-axis being perpendicular to the length of said of a said diode-laser bar, and wherein each of said anamorphic lenses is a cylindrical lens arranged such that said laser-light collected thereby is focussed thereby in said fast-axis.

9. The light-source of claim 8, wherein said output-aperture of the light-source is located at a common, fast-axis focal-plane of said plurality of cylindrical lenses.

10. The light-source of claim 1, wherein said emission-direction is parallel to the plane of said flat surface of said heat-sink.

11. The light-source of claim 10, wherein said optical delivery system includes a plurality of rectangular optical-waveguides, one thereof associated with each of said diode-laser bars, each of said optical-waveguides having a propagation axis, an entrance-face and an exit-face said entrance-face being arranged to collect laser-light only from the said diode-laser bar with which it is associated, each of said optical-waveguides associated with a said diode-laser bar rearward of an adjacent diode laser-bar in said emission direction being shaped such that laser-light collected thereby is transported over said adjacent said diode-laser bar, and wherein exit-faces of said plurality of optical-waveguides are collectively arranged to provide said output-aperture of the light-source.

12. The light-source of claim 11, wherein said entrance-faces of each of said rectangular optical-waveguides is arranged perpendicular to said propagation axis thereof and perpendicular to said emission-direction.

13. A light-source comprising:
   a heat-sink having a flat surface;
   a plurality of diode-laser bars each thereof having a front surface said front surface having a plurality of diode-lasers emitting-areas therein, laser-light being emitted from said emitting-areas in an emission-direction generally perpendicular to said front surface;
   said diode-laser bars being arranged parallel to each other, spaced apart in said emission-direction and thermally-coupled to said flat surface of said heat-sink, with said emitting-areas of said diode-laser bars facing the same direction and said emission-direction being at an acute angle to the plane of said flat surface of said heat-sink; and
   said acute angle and spacing of said diode-laser bars being selected such that laser-light emitted from one of said diode-laser bars is directed over an adjacent one of said diode-laser bars in the emission-direction.

14. The light-source of claim 13, wherein each of said diode-laser bars is thermally-coupled to said flat surface of said heat-sink via a wedge-shaped submount, said acute angle of said emission-direction with respect to said plane of said flat surface of said heat-sink being determined by a wedge-angle of said submount.

15. The light-source of claim 14, wherein there is an electrically-insulating pad between said submount and said flat surface of said heat-sink.

16. The light-source of claim 13, further including a plurality of rectangular optical-waveguides, one thereof associated with each of said diode-laser bars, each of said optical-waveguides having an elongated, generally rectangular entrance-face and an exit-face, said entrance-face located proximate the front surface of the said diode-laser bar with which it is associated for receiving laser-light emitted from said diode-laser emitting-areas, said received laser-light propagating along said optical-waveguide to said exit-face thereof.

17. The light-source of claim 16, wherein said entrance-faces of said waveguides are perpendicular to the propagation-axis of said waveguides and perpendicular to said emission-direction of said diode-laser bars.

18. The light-source of claim 17, wherein said exit-faces of said optical-waveguides are arranged to collectively provide an output-aperture of the light-source.

19. The light source of claim 13, wherein said entrance-face of each of said optical waveguides is arranged to collect laser-light emitted from all of said emitting-areas of the said laser-diode bar with which it is associated.

20. The light-source of claim 13, wherein each of said diode-laser bars has a cylindrical lens associated therewith, said cylindrical lens arranged to collimate laser-light emitted by the said diode-laser bar with which is associated.

21. The light-source of claim 13, wherein each of said diode-laser bars has a cylindrical lens associated therewith said cylindrical lens arranged to focus laser-light emitted by the said diode-laser bar with which is associated, in a fast axis thereof.

22. A light-source comprising:
 a heat-sink having a flat surface;
 a plurality of diode-laser bars each thereof having a front surface said front surface having a plurality of diode-lasers emitting-areas therein, laser-light being emitted from said emitting-areas in an emission-direction generally perpendicular to said front surface;
 said diode-laser bars being arranged parallel to each other, spaced apart in said emission-direction and thermally-coupled to said flat surface of said heat-sink, with said emitting-areas of said diode-laser bars facing the same direction and said emission-direction being at an acute angle to the plane of said flat surface of said heat-sink;
 a plurality of rectangular optical-waveguides, one thereof associated with each of said diode-laser bars, each of said optical-waveguides having an elongated, generally rectangular entrance-face and an exit-face, said entrance-face being perpendicular to a propagation-axis of said optical-waveguide and located proximate the front surface of the said diode-laser bar with which it is associated for receiving laser-light emitted from said diode-laser emitting-areas;
 said acute angle and said spacing of said diode-laser bars being selected such that said entrance-faces of said optical-waveguides are perpendicular to said emission-direction and such that a said optical-waveguide associated with one said diode-laser bar extends freely over an adjacent said diode-laser bar in said emission-direction; and
 wherein said exit-faces of said optical waveguides are arranged to collectively provide an output-aperture of the light-source.

23. The light-source of claim 22, wherein each of said diode-laser bars is thermally-coupled to said flat surface of said heat-sink via a wedge-shaped submount, said wedge-shaped submount having a wedge-angle about equal to said acute angle between said flat surface of said heat-sink and said emission-direction.

24. The light-source of claim 23, wherein flat surface of said heat-sink is a metal surface there is an electrically-insulating pad between said wedge-shaped submount and said flat surface of said heat-sink.

25. The light-source of claim 22, wherein said heat-sink is wedge-shaped and has a flat base, and said wedge shaped heat-sink has a wedge-angle equal to said acute angle between said flat surface and said emission-direction, said wedge-shaped heat-sink being arranged such that said flat base thereof is parallel to said emission-direction of said diode-laser bars.

26. The light-source of claim 22, wherein said flat surface of said heat-sink is an electrically-insulating surface and there is an electrically-conductive pad between said submount and said upper surface of said heat-sink.

27. The light-source of claim 26 wherein said heat-sink is formed from an electrically-insulating material.

28. The light-source of claim 26 wherein said heat-sink is formed from a metal and said flat surface of said heat-sink is a metal surface having a layer of an electrically-insulating material thereon.

29. The light-source of claim 28, wherein said electrically-insulating material is synthetic diamond.

30. A light-source, comprising:
 a heat-sink having a flat surface;
 a plurality of diode-laser bars each thereof having a front surface, said front surface having a plurality of diode-lasers emitting-areas therein, laser-light being emitted from said emitting-areas in an emission-direction generally perpendicular to said front surface;
 said diode-laser bars being arranged parallel to each other, thermally-coupled to said flat surface of said heat-sink, and spaced apart in said emission-direction with said emission direction being parallel to said flat surface of said heat-sink;
 a plurality of rigid rectangular optical-waveguides, one thereof associated with each of said diode-laser bars, each of said optical-waveguides having an elongated, generally rectangular entrance-face, an exit-face, said entrance-face located proximate the front surface of the said diode-laser bar with which it is associated, for receiving laser-light emitted from said diode-laser emitting-areas, said entrance face being perpendicular to said emission direction and to said propagation axis;
 each of said optical-waveguides associated with a said diode-laser bar rearward of an adjacent said diode laser-bar in said emission direction being shaped such that laser-light collected thereby is transported over said adjacent said diode-laser bar; and
 wherein exit-faces of said plurality of optical-waveguides are collectively arranged to provide said output-aperture of the light-source.

31. A light-source, comprising:
 at least two light-source units;
 each of said light-source units including a heat-sink having a flat surface and a plurality of diode-laser bars each thereof having a front surface, said front surface having a plurality of diode-lasers emitting-areas therein, laser-light being emitted from said emitting-areas in an emission-direction generally perpendicular to said front surface;
 said diode-laser bars being arranged parallel to each other, spaced apart in said emission-direction and thermally-coupled to said flat surface of said heat-sink; and an optical delivery system for collecting laser-light emitted by said diode-laser bars and delivering said collected laser-light to an output-aperture of the light-source.

32. The light-source of claim 31, wherein each said optical delivery system includes a plurality of rectangular optical-waveguides, one thereof associated with each of said diode-laser bars, each of said optical waveguides having an entrance-face and an exit-face, said entrance-face located proximate the diode-laser bar with which it is associated for collecting laser-light emitted thereby, and said exit-faces of said pluralities of optical waveguides of each of said light-source units being collectively arranged to form said output aperture of said light-source.

33. The light-source of claim 32 wherein said collectively-arranged exit-faces of said optical-waveguides are equally spaced apart.

34. A light-source comprising:

at least two light-source units;

each of said light-source units including wedge-shaped heat-sink having a base, and a flat upper-surface inclined to said base at a first acute-angle;

each of said light source units including a plurality of diode-laser bars each thereof having a front surface, said front surface having a plurality of diode-laser emitting-areas therein, laser-light being emitted from said emitting-areas in an emission-direction generally perpendicular to said front surface, said diode-laser bars being arranged parallel to each other, spaced apart in said emission-direction, thermally-coupled to said flat upper-surface of said heat-sink and arranged such that said emission-direction is at a second acute angle to said flat surface of said heat-sink;

each of said light-source units including a plurality of rigid rectangular optical-waveguides, one thereof associated with each of said diode-laser bars, each of said optical waveguides having an entrance-face, an exit-face and a propagation axis, said entrance-face located proximate the diode-laser bar with which it is associated for collecting laser-light emitted thereby and begin perpendicular to said emission-direction and said propagation axis; and said light-source units being arranged, one above the other, with optical-waveguides in both pluralities thereof being shaped such that exit-faces thereof are collectively arranged, co-planar, with equal spacing between adjacent ones thereof to form an output-aperture of said light-source.

* * * * *